United States Patent
Xu et al.

(10) Patent No.: US 10,134,817 B2
(45) Date of Patent: Nov. 20, 2018

(54) OLED DISPLAY PANEL, DISPLAY DEVICE AND DISPLAY SYSTEM

(71) Applicants: Boe Technology Group Co., Ltd., Beijing (CN); Beijing Boe Display Technology Co., Ltd., Beijing (CN)

(72) Inventors: Liyan Xu, Beijing (CN); Junwei Wang, Beijing (CN); Ming Tian, Beijing (CN); Jiarong Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/723,715

(22) Filed: Oct. 3, 2017

(65) Prior Publication Data

US 2018/0026083 A1 Jan. 25, 2018

Related U.S. Application Data

(62) Division of application No. 15/155,224, filed on May 16, 2016.

(30) Foreign Application Priority Data

Sep. 24, 2015 (CN) .......................... 2015 1 0617871

(51) Int. Cl.
*H01L 27/32* (2006.01)
*H04N 13/359* (2018.01)
(Continued)

(52) U.S. Cl.
CPC ....... *H01L 27/3232* (2013.01); *G09G 3/2096* (2013.01); *H04N 13/0409* (2013.01);
(Continued)

(58) Field of Classification Search
CPC .. G01S 15/46; G01S 15/931; G01S 2015/938; G09G 2300/04; G09G 2370/18;
(Continued)

(56) References Cited

U.S. PATENT DOCUMENTS 5,831,765 A * 11/1998 Nakayama ........ G02F 1/133504
359/464
5,989,573 A * 11/1999 Remy ....................... A61K 8/26
424/401
(Continued)

FOREIGN PATENT DOCUMENTS

| CN | 1924639 A | 3/2007 |
|---|---|---|
| CN | 104269432 A | 1/2015 |
| CN | 104327060 A | 2/2015 |

OTHER PUBLICATIONS

First Office Action for Chinese Patent Application No. 201510617871.2 dated Sep. 25, 2017.

*Primary Examiner* — Mohammed Shamsuzzaman
(74) *Attorney, Agent, or Firm* — Calfee, Halter & Griswold LLP

(57) ABSTRACT

An OLED display panel, a display device, and a display system. The OLED display panel comprises a base plate, first OLED display elements arranged in an array on a side of the base plate, and a first photochromic layer arranged on a side of the first OLED display elements. The first photochromic layer comprises first stripe shaped photochromic bodies and first stripe shaped openings arranged periodically and alternately, and is switchable between a transparent state and an opaque state. When the first photochromic layer stays in the opaque state, the first photochromic layer enables the OLED display panel to realize 3D display on the side where the first photochromic layer is arranged. 2D and 3D display (Continued)

modes are realized on a side of the display panel, which improves user experience and has a low cost.

10 Claims, 6 Drawing Sheets

(51) Int. Cl.
*G09G 3/20* (2006.01)
*H05B 33/08* (2006.01)
*H05B 37/02* (2006.01)
*H04N 13/04* (2006.01)
*H04N 13/31* (2018.01)
*H04N 13/356* (2018.01)
*G09G 3/00* (2006.01)
*G09G 3/3208* (2016.01)

(52) U.S. Cl.
CPC ......... *H04N 13/0452* (2013.01); *H04N 13/31* (2018.05); *H04N 13/356* (2018.05); *H04N 13/359* (2018.05); *H05B 33/0896* (2013.01); *H05B 37/0272* (2013.01); *G09G 3/003* (2013.01); *G09G 3/3208* (2013.01); *G09G 2300/04* (2013.01); *G09G 2370/18* (2013.01); *H01L 2251/5323* (2013.01); *H04N 2213/001* (2013.01)

(58) Field of Classification Search
CPC .............. G09G 3/2096; H01L 27/3232; H04N 13/0409; H04N 13/0452; H04N 13/0454; H04N 13/31; H04N 13/356; H04N 13/359; H04N 2213/001

USPC .............. 257/40, 82, 89; 359/267, 244, 464; 424/401

See application file for complete search history.

(56) References Cited

U.S. PATENT DOCUMENTS

| | | | |
|---|---|---|---|
| 6,468,550 B1 * | 10/2002 | Remy | A61K 8/20 424/401 |
| 7,651,282 B2 * | 1/2010 | Zomet | G03B 11/00 396/457 |
| 9,063,382 B2 * | 6/2015 | Kim | G02F 1/134309 |
| 2007/0047058 A1 * | 3/2007 | Lim | G02B 27/2214 359/267 |
| 2007/0091638 A1 * | 4/2007 | Ijzerman | G02B 6/0041 362/611 |
| 2007/0206134 A1 * | 9/2007 | Sung | H04N 13/359 349/96 |
| 2010/0284085 A1 * | 11/2010 | Laakkonen | G02B 6/12007 359/575 |
| 2011/0304530 A1 * | 12/2011 | Yeh | G02B 27/2264 345/156 |
| 2012/0081776 A1 * | 4/2012 | Yeh | G02B 27/2214 359/273 |
| 2013/0009859 A1 * | 1/2013 | Woo | G02B 27/2214 345/156 |
| 2016/0136927 A1 * | 5/2016 | Shin | B32B 7/12 428/304.4 |
| 2016/0252740 A1 * | 9/2016 | Gai | G02B 27/2264 359/244 |

* cited by examiner

OLED DISPLAY PANEL, DISPLAY DEVICE AND DISPLAY SYSTEM

RELATED APPLICATIONS

The present application is a divisional of U.S. Ser. No. 15/155,224, filed May 16, 2016, which claims the benefit of Chinese Patent Application No. 201510617871.2, filed on Sep. 24, 2015, the entire disclosures of which are incorporated herein by reference.

TECHNICAL FIELD

The present invention relates to the field of display technique, and in particular an OLED display panel, a display device, and a display system.

BACKGROUND ART

OLEDs (organic light emitting diodes) belong to an organic film electroluminescent device. Since OLEDs have advantages like simple fabrication process, low cost, easy to form flexible structure, and wide viewing angle, a display technique utilizing organic light emitting diodes has become an important display technique.

Currently, most of OLED display panels in the market are of single side emitting type, and can hardly meet the diverse demand in the market.

For example, in some scenarios, it is required for the display panel to operate in a 2D (two dimensional) display mode or 3D (three dimensional) display mode according to a user selection. However, 2D or 3D display mode based on the user selection currently can not be realized by a single OLED display panel.

SUMMARY

Embodiments of the present invention provide an OLED display panel, a display device, and a display system, which realizes 2D and 3D display modes on a side of the display panel, improves user experience, and has a low cost.

In a first aspect, an OLED display panel is provided, comprising a base plate, and a plurality of first OLED display elements which are arranged in an array on a side of the base plate. The OLED display panel further comprises a first photochromic layer, which is arranged on a side of the first OLED display elements, comprises first stripe shaped photochromic bodies and first stripe shaped openings being arranged periodically and alternately, and is switchable between a transparent state and an opaque state. When the first photochromic layer stays in the opaque state, the first photochromic layer enables the OLED display panel to realize 3D display on the side where the first photochromic layer is arranged.

In a first possible implementation of the first aspect, the OLED display panel further comprises a second photochromic layer, which comprises second stripe shaped photochromic bodies and second stripe shaped openings which are arranged periodically and alternately, and is switchable between a transparent state and an opaque state. The first photochromic layer and the second photochromic layer are arranged on respective sides of the base plate. When the second photochromic layer stays in the opaque state, the second photochromic layer enables the OLED display panel to realize 3D display on the side where the second photochromic layer is arranged.

In a second possible implementation, the first OLED display elements are dual side emitting OLED display elements. In a direction perpendicular to the base plate, the second stripe shaped photochromic bodies have projections overlapping those of the first stripe shaped photochromic bodies.

In a third possible implementation, the first OLED display elements are single side emitting OLED display elements, and emit light in a direction away from the base plate. The OLED display panel further comprises second OLED display elements, the second OLED display elements and the first OLED display elements being arranged at respective side of the base plate. The second OLED display elements are single side emitting OLED display elements, and emit light in a direction away from the base plate.

In a possible implementation of the first aspect, the OLED display panel further comprises third OLED display elements. The third OLED display elements and the first OLED display elements are arranged at respective side of the base plate, and the third OLED display elements are arranged alternately with respect to the first OLED display elements. The first OLED display elements are dual side emitting OLED display elements. The third OLED display elements are single side emitting OLED display elements, and emit light in a direction away from the base plate.

In a another possible implementation of the first aspect, the OLED display panel further comprises third OLED display elements. The third OLED display elements and the first OLED display elements are arranged at respective side of the base plate, and the third OLED display elements are arranged alternately with respect to the first OLED display elements. The first OLED display elements are single side emitting OLED display elements, and emit light in a direction away from the base plate. The third OLED display elements are single side emitting OLED display elements, and emit light in a direction away from the base plate.

In a another possible implementation of the first aspect, the first photochromic layer is an ultraviolet photochromic layer. The first photochromic layer comprises 2-bis-diphenyl-imidazol paracyclophane doped with titanium dioxide nanoparticles or zinc oxide nanoparticles.

In a possible implementation of the first aspect, the first photochromic layer is an infrared photochromic layer. The first photochromic layer comprises bisthienylethenes derivatives doped with titanium dioxide nanoparticles or zinc oxide nanoparticles.

In some implementations, the first photochromic layer is an ultraviolet photochromic layer, and the second photochromic layer is an infrared photochromic layer.

In some implementations, the first photochromic layer is an infrared photochromic layer, and the second photochromic layer is an ultraviolet photochromic layer.

In a second aspect, a display device is provided, comprising the OLED display panel of the above-mentioned first aspect.

In some implementations of the second aspect, the display device further comprises a light emitter, which is configured to control the first photochromic layer to switch between the transparent and the opaque state.

In a third aspect, a display system is provided, comprising the display device of the second aspect and a remote control. The remote control comprises a light emitter, which is configured to control the first photochromic layer to switch between the transparent and the opaque state.

Embodiments of the present invention provide an OLED display panel, a display device, and a display system. The OLED display panel comprises a base plate, first OLED display elements arranged in an array on a side of the base plate, and a first photochromic layer arranged on a side of the first OLED display elements. The first photochromic layer comprises first stripe shaped photochromic bodies and first stripe shaped openings arranged periodically and alternately, and is switchable between a transparent state and an opaque state. When the first photochromic layer stays in the opaque state, the first photochromic layer enables the OLED display panel to realize 3D display on the side where the first photochromic layer is arranged. In this way, in case the first OLED display elements are single side emitting, by controlling the first photochromic layer to switch between the transparent state and the opaque state, 2D and 3D display are realized on a side of the OLED display panel where the first OLED display elements are arranged. When the first OLED display elements are dual side emitting, by controlling the first photochromic layer to switch between the transparent state and the opaque state, 2D and 3D display are realized on a side of the OLED display panel where the first OLED display elements are arranged, and 2D display is realized on the other side.

By controlling a state of the first photochromic layer, 2D and 3D display are realized on a side of the OLED display panel where the first photochromic layer is arranged. Namely, 2D and 3D display modes are realized on a side by a single OLED display panel. As compared with the prior art, embodiments of the present invention realize two display modes in a single OLED display panel, which thus improves user experience. On basis of this, as compared with the case in which two OLED display panels are utilized to realize these two display modes, the cost is reduced in these embodiments.

BRIEF DESCRIPTION OF DRAWINGS

In order to more clearly illustrate technical solutions in embodiments of the present invention, accompanying drawings for illustrating these embodiments will be briefly introduced. It is apparent that the following drawings merely represent some embodiments of the present invention, and that a person having ordinary skill in the art can obtain other drawings from these drawings without undue experimentation.

DETAILED DESCRIPTION OF EMBODIMENTS

Figure 1A:
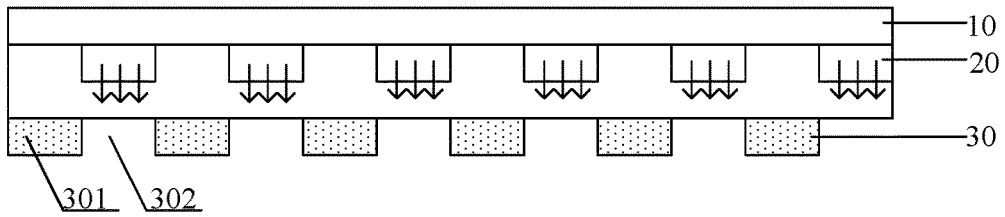
FIG. 1a is a first structural view illustrating an OLED display panel in an embodiment of the present invention.

The specific embodiments of this disclosure shall be explained in details as follows with reference to the drawings. The drawings of this disclosure schematically illustrate structures, portions and/or steps related to the inventive concepts, but do not illustrate or only partially illustrate structures, portions and/or steps unrelated to the inventive concepts.

The following indicators will be used throughout the specification to reference component illustrated in the figures: 01—OLED display panel; 02—light emitter; 03—display device; 04—remote control; 05—display system; 10—base plate; 20—first OLED display elements; 30—first photochromic layer; 301—first stripe shaped photochromic bodies; 302—first stripe shaped openings; 40—second photochromic layer; 401—second stripe shaped photochromic bodies; 402—second stripe shaped openings; 50—second OLED display elements; 60—third OLED display elements; 70—third photochromic layer; 701—third stripe shaped photochromic bodies; 702—third stripe shaped openings.

Embodiments of the present invention provide an OLED display panel 01. As shown in FIG. 1-FIG. 7, the OLED display panel 01 comprises a base plate 10, and a plurality of first OLED display elements 20 which are arranged in an array on a side of the base plate 10. The OLED display panel 01 further comprises a first photochromic layer 30 which is arranged on a side of the first OLED display elements 20. The first photochromic layer 30 comprises first stripe shaped photochromic bodies 301 and first stripe shaped openings 302 which are arranged periodically and alternately.

The first photochromic layer 30 is switchable between a transparent state and an opaque state. When the first photochromic layer 30 stays in the opaque state, the first photochromic layer 30 enables the OLED display panel to realize 3D display on the side where the first photochromic layer 30 is arranged.

The first OLED display elements 20 comprises an anode, an organic material functional layer, and a cathode.

The organic material functional layer at least comprises a light emitting layer. On basis of this, in order to improve the efficiency for injecting electrons and holes into the light emitting layer, the organic material functional layer further comprises an electron transport layer and a hole transport layer, and further comprises an electron injection layer between the cathode and the electron transport layer, as well as a hole injection layer between the hole transport layer and the anode.

According to the materials comprising the anode and the cathode, the OLED display element is divided into a single side emitting OLED display element and a dual side emitting OLED display element. In case one of the anode and the cathode is opaque, the first OLED display elements 20 are single side emitting. In case both the anode and the cathode are transparent, the first OLED display elements 20 are dual side emitting.

According to the material of the anode and the cathode, the single side emitting OLED display element emits light in different directions. In particular, in case the anode is arranged close to the base plate 10, the cathode is arranged away from the base plate 10, the anode is transparent (e.g., comprising ITO), and the cathode is opaque (e.g., comprising a relatively thick metal), light exits through the anode, namely the light emitting direction is towards the base plate 10. In case the anode is opaque (e.g., comprising a structure of a transparent conductive layer/a metal layer/a transparent conductive layer), the cathode is transparent (e.g., comprising a relatively thick metal), light exits through the cathode, namely the light emitting direction is away from the base plate 10. In some embodiments, the anode may take the place of the cathode as described herein, and vice versa. Such an embodiment will not be repeated herein for the sake of simplicity.

It is noted that, firstly, embodiments of the present invention do not intend to limit the material of the first photochromic layer 30, provided that the first photochromic layer 30 can switch between the transparent state and the opaque state when it is illuminated.

The first photochromic layer 30 comprises first stripe shaped photochromic bodies 301 and first stripe shaped openings 302 which are arranged periodically and alternately. Therefore, when the first photochromic layer 30 stays in the opaque state, i.e., when the first stripe shaped photochromic bodies 301 stay in the opaque state, the first photochromic layer 30 acts as a grating, so that the OLED display panel 01 displays in the 3D mode.

To realize display function, the OLED display panel 01 comprises a plurality of display units, and each of the display units comprises at least three sub-pixel units. Each sub-pixel unit comprises the first OLED display elements 20, and the first OLED display elements 20 of the sub-pixel unit in each display unit emit light of three primary colors, for example red, green, and blue light. On basis of this, it is required for the first photochromic layer 30 to be arranged separately from the above-mentioned display unit.

Secondly, since the first photochromic layer 30 functions to enable the OLED display panel 01 to realize 3D display on a side where the first photochromic layer 30 is arranged when necessary, it will be understood by the person having ordinary skill in the art that the first photochromic layer 30 is required to be arranged on a side of the first OLED display elements 20 where the light exits.

Figure 1B:
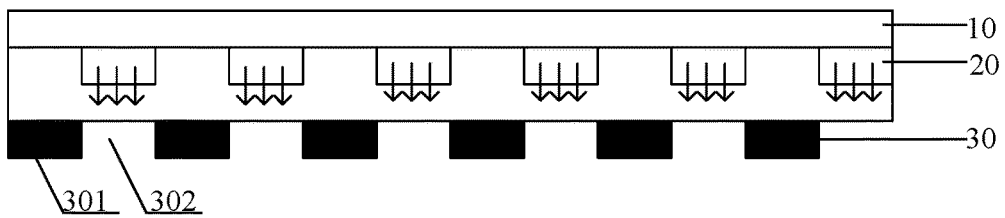
FIG. 1b is a schematic view illustrating the OLED display panel of FIG. 1a in which a first photochromic layer stays in an opaque state.

In particular, when the first OLED display elements 20 are single side emitting OLED display elements, as shown in FIGS. 1a and 1b, the first photochromic layer 30 is arranged on a side of the first OLED display elements 20 away from the base plate 10.

As shown in FIG. 1a, when the first photochromic layer 30 stays in the transparent state, the OLED display panel 01 operates in the 2D display mode. As shown in FIG. 1b, when the first photochromic layer 30 stays in the opaque state, the first photochromic layer 30 acts as a grating, so that the OLED display panel 01 operates in the 3D display mode on a side where the first photochromic layer 30 is arranged.

Figure 2A:
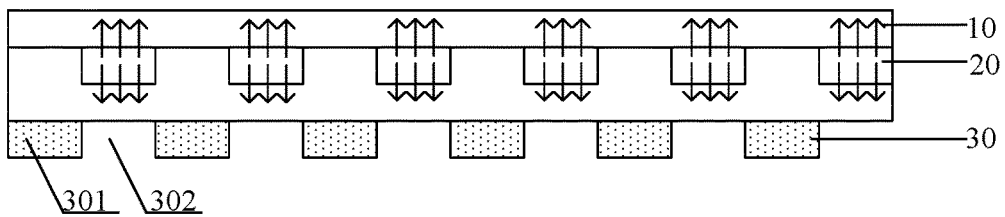
FIG. 2a is a second structural view illustrating an OLED display panel in an embodiment of the present invention.
Figure 2B:
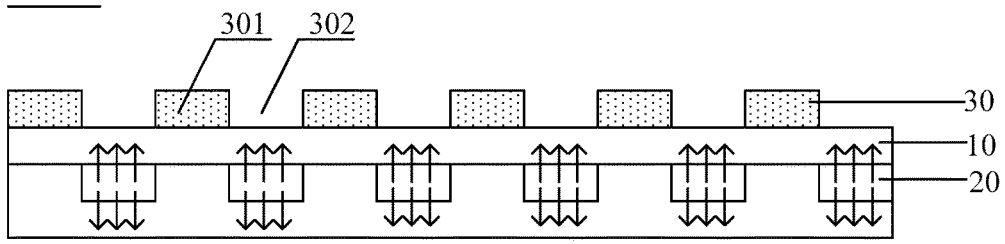
FIG. 2b is a third structural view illustrating an OLED display panel in an embodiment of the present invention.
Figure 2C:
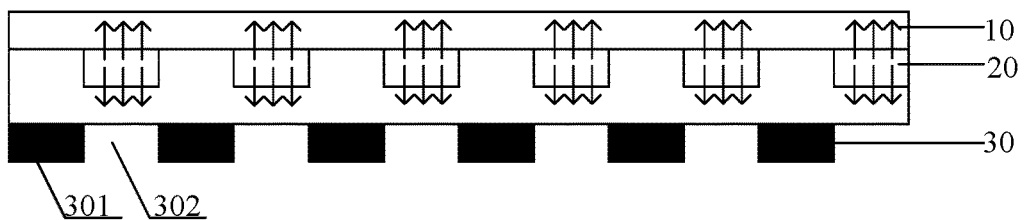
FIG. 2c is a schematic view illustrating the OLED display panel of FIG. 2a in which a first photochromic layer stays in an opaque state.

When the first OLED display elements 20 are dual side emitting OLED display elements, as shown in FIGS. 2a, 2b and 2c, the first photochromic layer 30 is arranged at any side.

As shown in FIG. 2a and FIG. 2b, when the first photochromic layer 30 stays in the transparent state, the OLED display panel 01 operates in the 2D display mode on both sides. As shown in FIG. 2c, when the first photochromic layer 30 stays in the opaque state, the first photochromic layer 30 acts as a grating, so that the OLED display panel 01 operates in the 3D display mode on a side where the first photochromic layer 30 is arranged, and operates in the 2D display mode on the other side.

Thirdly, in embodiments of the present invention, openings have a width A, A=ia/(i+a), wherein i is a pupil distance, and a is a width of the sub-pixel unit.

Fourthly, in drawings for embodiments of the present invention, only the relationship between stripe shaped photochromic bodies 301 of the first photochromic layer 30 and the first OLED display elements 20 in the sub-pixel unit are illustrated. Embodiments of the present invention do not intend to limit in this regard. It is only required that, when stripe shaped photochromic bodies 301 stay in the opaque state, the stripe shaped photochromic bodies 301 in the opaque state enable the OLED display panel 01 to operate in the 3D display mode on a side where the first OLED display elements 20 are arranged.

Embodiments of the present invention provide an OLED display panel 01, comprising a base plate 10, and a plurality of first OLED display elements 20 which are arranged on a side of the base plate 10. The OLED display panel 01 further comprises a first photochromic layer 30 which is arranged on a side of the first OLED display elements 20. The first photochromic layer 30 comprises first stripe shaped photochromic bodies 301 and first stripe shaped openings 302 which are arranged periodically and alternately. The first photochromic layer 30 is switchable between a transparent state and an opaque state. When the first photochromic layer 30 stays in the opaque state, the first photochromic layer 30 enables the OLED display panel to operate in the 3D display mode on a side where the first photochromic layer 30 is arranged. In this way, when the first OLED display elements 20 are single side emitting, by controlling the first photochromic layer 30 to switch between the transparent state and the opaque state, 2D and 3D display are realized on a side of the OLED display panel 01 where the first OLED display elements 20 are arranged. When the first OLED display elements 20 are dual side emitting, by controlling the first photochromic layer 30 to switch between the transparent state and the opaque state, 2D and 3D display are realized on a side of the OLED display panel 01 where the first OLED display elements 20 are arranged, and 2D display is realized on the other side.

By controlling a state of the first photochromic layer 30, 2D and 3D display are realized on a side of the OLED display panel 01 where the first photochromic layer 30 is arranged. Namely, 2D and 3D display modes are realized on a side by a single OLED display panel 01. As compared with the prior art, embodiments of the present invention realize two display modes in a single OLED display panel 01, which thus improves user experience. On basis of this, as compared with the case in which two OLED display panels are utilized to realize these two display modes, the cost is reduced in these embodiments.

Optionally, as shown in FIGS. 3a, 3b, 4a and 4b, the OLED display panel 01 further comprises a second photochromic layer 40. The second photochromic layer 40 comprises second stripe shaped photochromic bodies 401 and second stripe shaped openings 402 which are arranged periodically and alternately.

The first photochromic layer 30 and the second photochromic layer 40 are arranged on respective side of the base plate 10. The second photochromic layer 40 is switchable between a transparent state and an opaque state. When the second photochromic layer 40 stays in the opaque state, the second photochromic layer 40 enable the OLED display panel 01 to operate in the 3D display mode on a side where the second photochromic layer 40 is arranged.

Figure 3A:
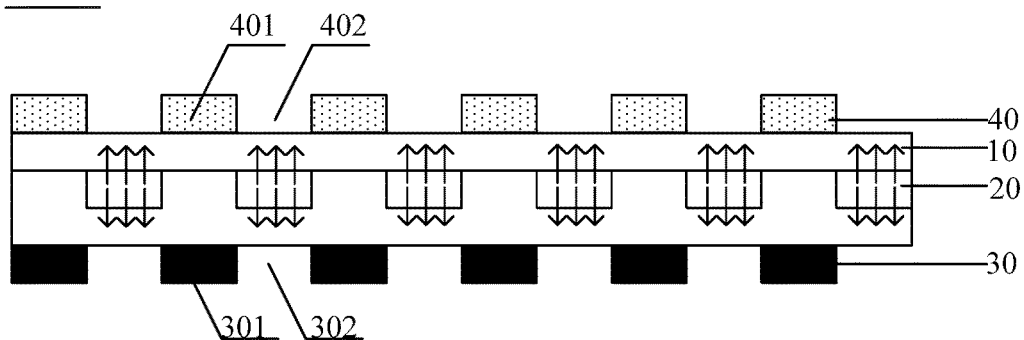
FIG. 3a is a fourth structural view illustrating an OLED display panel in an embodiment of the present invention.
Figure 3B:
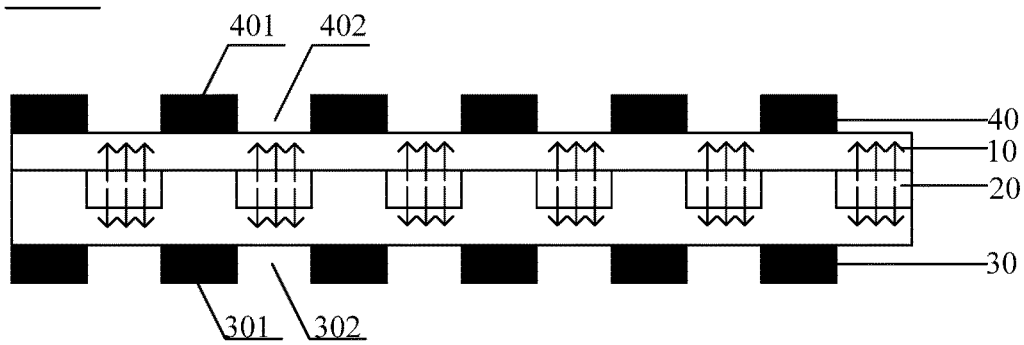
FIG. 3b is a schematic view illustrating the OLED display panel of FIG. 3a in which a second photochromic layer stays in an opaque state.

In particular, as shown in FIGS. 3a and 3b, the first OLED display elements 20 are dual side emitting OLED display elements. In a direction perpendicular to the base plate 10, the second stripe shaped photochromic bodies 401 have projections overlapping those of the first stripe shaped photochromic bodies 301.

As shown in FIG. 3a, when the second photochromic layer 40 stays in the transparent state, the OLED display panel 01 operates in the 2D display mode on a side where the second photochromic layer 40 is arranged. As shown in FIG. 3b, when the second photochromic layer 40 stays in the opaque state, the second photochromic layer 40 acts as a grating, so that the OLED display panel 01 operates in the 3D display mode on a side where the second photochromic layer 40 is arranged.

Figure 4A:
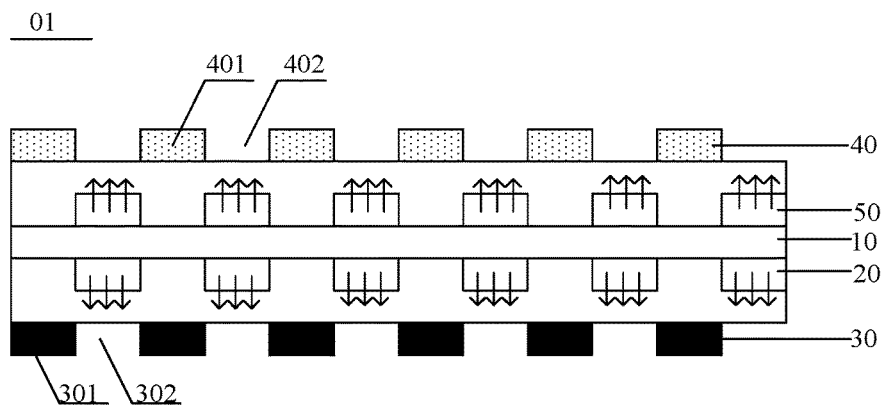
FIG. 4a is a fifth structural view illustrating an OLED display panel in an embodiment of the present invention.
Figure 4B:
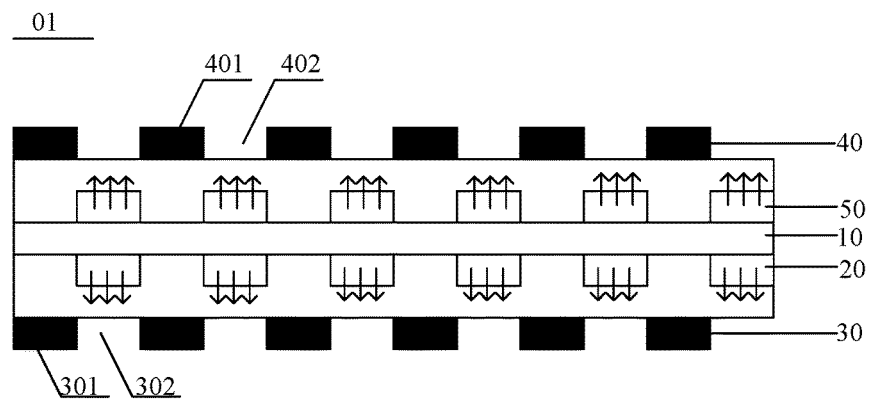
FIG. 4b is a schematic view illustrating the OLED display panel of FIG. 4a in which a second photochromic layer stays in an opaque state.

As shown in FIG. 4a and FIG. 4b, the first OLED display elements 20 are single side emitting OLED display elements, and emit light in a direction away from the base plate 10. The OLED display panel 01 further comprises second OLED display elements 50. The second OLED display elements 50 and the first OLED display elements 20 are arranged on respective side of the base plate 10. The second OLED display elements 50 are single side emitting OLED display elements, and emit light in a direction away from the base plate 10.

Namely, as shown in FIG. 4a, when the second photochromic layer 40 stays in the transparent state, the OLED display panel 01 operates in the 2D display mode on a side where the second photochromic layer 40 is arranged. As shown in FIG. 4b, when the second photochromic layer 40 stays in the opaque state, the second photochromic layer 40 acts as a grating, and the OLED display panel 01 operates in the 3D display mode on a side where the second photochromic layer 40 is arranged.

It is noted that, firstly, in embodiments of the present invention, the second OLED display elements 50 and the first OLED display elements 20 have an identical structure, which is not repeated herein for simplicity.

Secondly, since the second photochromic layer 40 functions to enable the OLED display panel 01 to realize the 3D display mode on a side where the second photochromic layer 40 is arranged when necessary, it will be understood by the person having ordinary skill in the art that the second photochromic layer 40 is required to be arranged on a side of the second OLED display elements 50 where light exits.

Thirdly, in order to control the first photochromic layer 30 and the second photochromic layer 40 respectively, in embodiments of the present invention, the first photochromic layer 30 and the second photochromic layer 40 comprise different materials. Namely, upon being illuminated by different light, the first photochromic layer 30 and the second photochromic layer 40 switch between the transparent state and the opaque state accordingly.

Fourthly, on a side of the OLED display panel 01 where the second OLED display elements 50 are arranged, a plurality of display units are also arranged. Each display unit comprises at least three sub-pixel units. Each sub-pixel unit comprises the second OLED display elements 50, and the second OLED display elements 50 in the sub-pixel unit of each display unit emit light of three primary colors, for example red, green, and blue light. On basis of this, it is required for the second photochromic layer 40 to be arranged separately from the above-mentioned display unit.

Figure 5A:
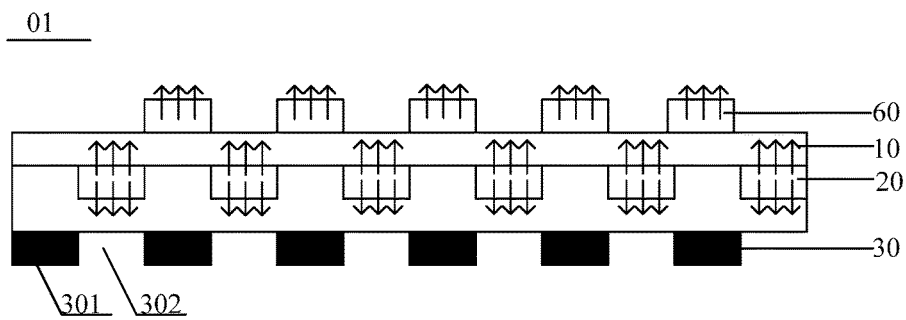
FIG. 5a is a sixth structural view illustrating an OLED display panel in an embodiment of the present invention.
Figure 5B:
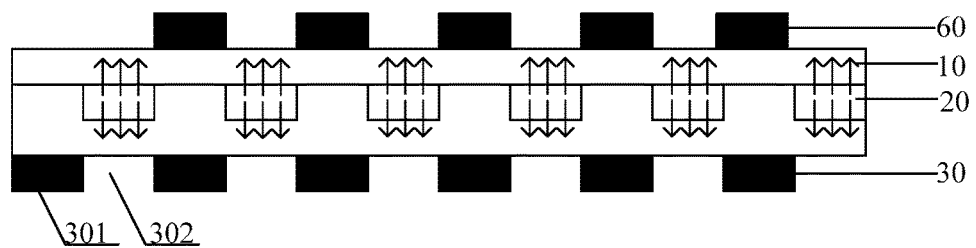
FIG. 5b is a schematic view illustrating the OLED display panel of FIG. 5a in which a third OLED display elements does not operate to display.
Figure 6:
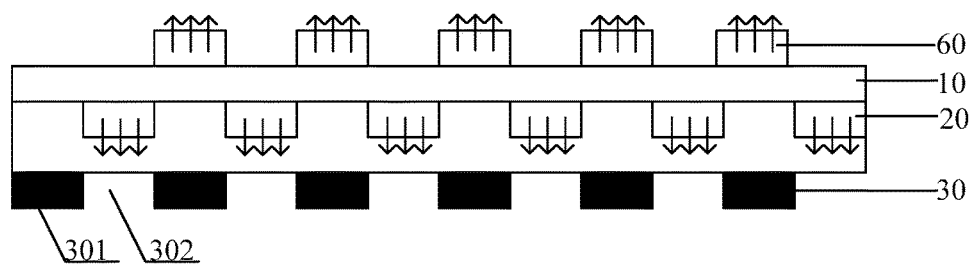
FIG. 6 is a seventh structural view illustrating an OLED display panel in an embodiment of the present invention.

Optionally, as shown in FIG. 5a, FIG. 5b and FIG. 6, the OLED display panel 01 further comprises third OLED display elements 60. The third OLED display elements 60 and the first OLED display elements 20 are arranged on respective side of the base plate 10, and the third OLED display elements 60 are arranged alternately with respect to the first OLED display elements 20.

As shown in FIG. 5a and FIG. 5b, the first OLED display elements 20 are dual side emitting OLED display elements. Alternatively, as shown in FIG. 6, the first OLED display elements 20 are single side emitting OLED display elements, and emit light in a direction away from the base plate. As shown in FIG. 5a and FIG. 6, the third OLED display elements 60 are single side emitting OLED display elements, and emit light in a direction away from the base plate.

In particular, as shown in FIG. 5a and FIG. 6, when the third OLED display elements 60 operates to display normally, the OLED display panel 01 operates in the 2D display mode on a side where the third OLED display elements 60 are arranged. As shown in FIG. 5b, when the third OLED display elements 60 do not operate to display (i.e., the third OLED display elements 60 do not emit light), the third OLED display elements 60 act as a grating, so that the OLED display panel 01 operates in the 3D display mode on a side where the third OLED display elements 60 are arranged.

Herein, in the case of FIG. 5a, as for a side of the OLED display panel 01 where the third OLED display elements 60 are arranged, not only the third OLED display elements 60 emit light, but the first OLED display elements 20 emit light, which improves resolution.

It is noted that, firstly, the third OLED display elements 60 are arranged alternately with respect to the first OLED display elements 20. Namely, in a direction perpendicular to the base plate 10, projections of the third OLED display elements 60 onto the base plate 10 do not overlap completely those of the first OLED display elements 20 onto the base plate 10 (e.g., partially overlapping, or no overlapping at all).

Secondly, in embodiments of the present invention, the third OLED display elements 60 and the first OLED display elements 20 have an identical structure, which is not repeated herein for simplicity.

Thirdly, on a side of the OLED display panel 01 where the third OLED display elements 60 are arranged, a plurality of display units are also arranged. Each display unit comprises at least three sub-pixel units. Each sub-pixel unit comprises the third OLED display elements 60, and the third OLED display elements 60 in the sub-pixel unit of each display unit emit light of three primary colors, for example red, green, and blue light.

Figure 7A:
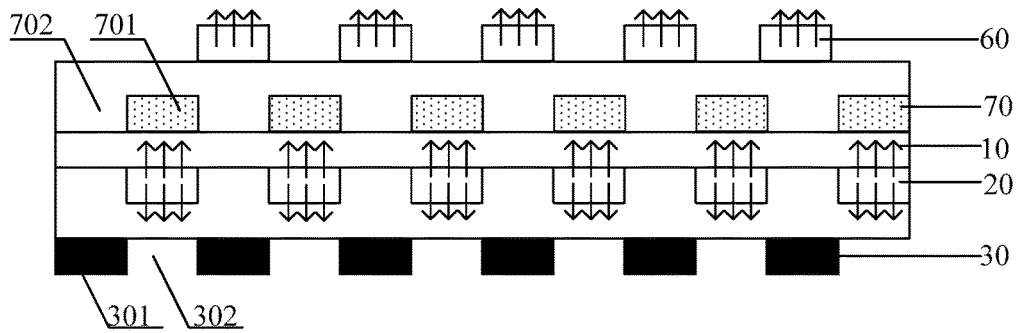
FIG. 7a is an eighth structural view illustrating an OLED display panel in an embodiment of the present invention.
Figure 7B:
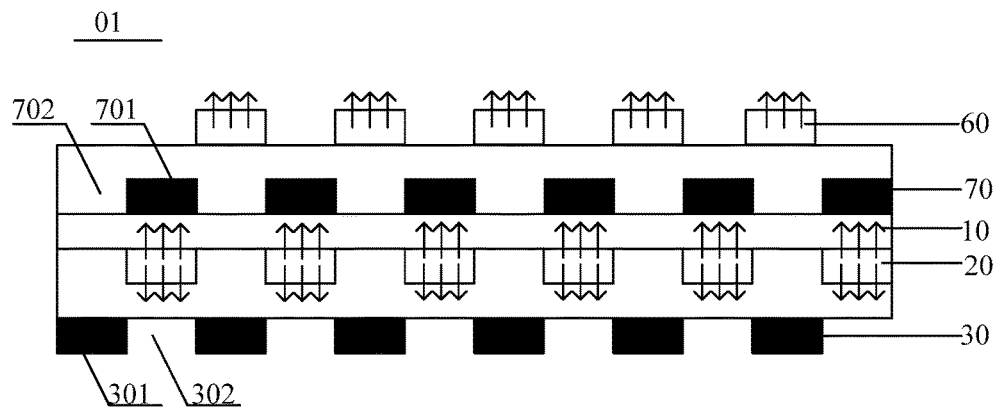
FIG. 7b is a schematic view illustrating the OLED display panel of FIG. 7a in which a third photochromic layer stays in an opaque state.
Figure 7C:
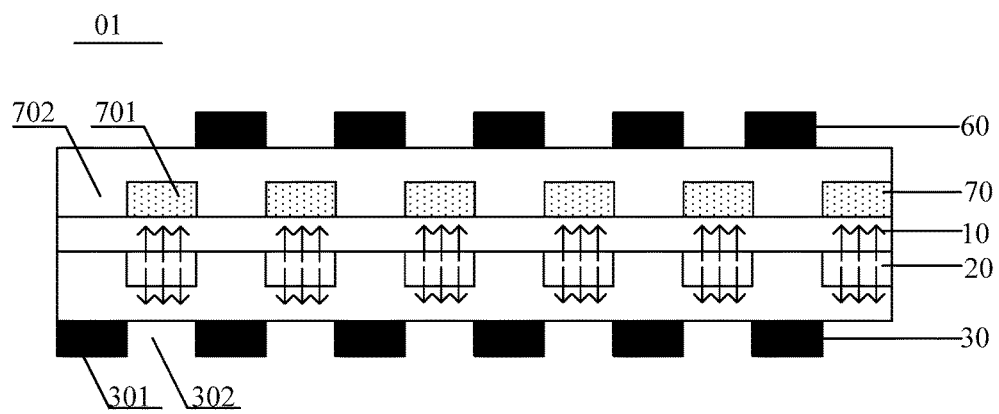
FIG. 7c is a schematic view illustrating the OLED display panel of FIG. 7a in which a third OLED display elements does not operate to display.

Of course, as shown in FIG. 7a, FIG. 7b and FIG. 7c, the OLED display panel 01 further comprises a third photochromic layer 70 between the base plate 10 and the third OLED display elements 60. The third photochromic layer 70 comprises third stripe shaped photochromic bodies 701 and third stripe shaped openings 702 which are arranged periodically and alternately. The third photochromic layer 70 is switchable between a transparent state and an opaque state. The third stripe shaped photochromic bodies 701 correspond to the first OLED display elements 20. The first OLED display elements 20 are dual side emitting display elements.

As shown in FIG. 7a, when the third photochromic layer 70 stays in the transparent state, and the third OLED display elements 60 emit light, the OLED display panel 01 operates in the 2D display mode on a side where the third photochromic layer 70 is arranged. As shown in FIG. 7b, when the third photochromic layer 70 stays in the opaque state, and the third OLED display elements 60 emit light, the OLED display panel 01 operates in the 2D display mode on a side where the third photochromic layer 70 is arranged. As shown in FIG. 7c, when the third photochromic layer 70 stays in the transparent state, and the third OLED display elements 60 do not emit light, the OLED display panel 01 operates in the 3D display mode on a side where the third photochromic layer 70 is arranged.

It is noted that, the third photochromic layer 70 comprises the same material as that of the above-mentioned the second photochromic layer 40.

It is known from the above analysis that embodiments of the present invention realize 2D display on both sides, 3D display on both sides, 2D display on a side/3D display on the other side, so as to meet different demand and improve user experience.

Optionally, the first photochromic layer 30 is an ultraviolet photochromic layer. The first photochromic layer 30 comprises 2-bis-diphenyl-imidazol paracyclophane doped with titanium dioxide nanoparticles or zinc oxide nanoparticles.

When the first photochromic layer 30 is illuminated by ultraviolet light, the stripe shaped photochromic bodies 301 of the first photochromic layer 30 turn into the opaque state, so that the first photochromic layer 30 turns into a grating stripe state. When not illuminated by the ultraviolet light, the first photochromic layer 30 turns into the transparent state.

Alternatively, the first photochromic layer 30 is an infrared photochromic layer. The first photochromic layer 30 comprises bisthienylethenes derivatives doped with titanium dioxide nanoparticles or zinc oxide nanoparticles.

When the first photochromic layer 30 is illuminated by infrared light, the stripe shaped photochromic bodies 301 of the first photochromic layer 30 turn into the opaque state, so that the first photochromic layer 30 turns into a grating strip state. When not illuminated by infrared light, the first photochromic layer 30 turns into the transparent state.

Furthermore, in case the OLED display panel 01 comprises the second photochromic layer 40, the first photochromic layer 30 is an ultraviolet photochromic layer (or an infrared photochromic layer) and the second photochromic layer 40 is an infrared photochromic layer (or an ultraviolet photochromic layer).

In case the first photochromic layer 30 is an ultraviolet photochromic layer, the second photochromic layer 40 is an infrared photochromic layer. Alternatively, in case the first photochromic layer 30 is an infrared photochromic layer, the second photochromic layer 40 is an ultraviolet photochromic layer.

For example, apart from the anode, the organic material functional layer, and the cathode, all of the above-mentioned OLED display elements further comprise thin film transistors. The thin film transistors comprise a gate, a gate insulating layer, a semiconductor active layer, a source, and a drain. The drain is electrically connected with the anode.

It is noted that embodiments of the present invention do not intend to limit the type of the thin film transistors. For example, the thin film transistors are amorphous silicon thin film transistors, low temperature poly-silicon thin film transistors, metal oxide semiconductor thin film transistors, organic thin film transistors. Furthermore, the thin film transistors for example are of a bottom gate type or a top gate type.

Figure 8A:
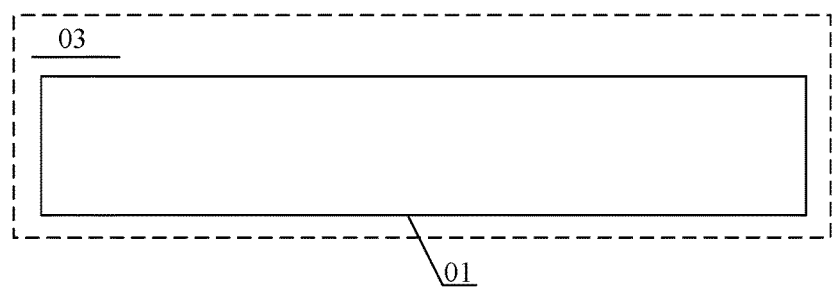
FIG. 8a is a first structural view illustrating a display device in an embodiment of the present invention.

Embodiments of the present invention further provide a display device. As shown in FIG. 8a, the display device 03 comprises the above-mentioned OLED display panel 01. It is noted that the OLED display panel 01 is the OLED display panel as described in any one of the above embodiment.

The above-mentioned display device is any product or component with a display function, e.g., an OLED display, an OLED TV, a digital photo frame, a mobile phone, and a tablet computer.

Figure 8B:
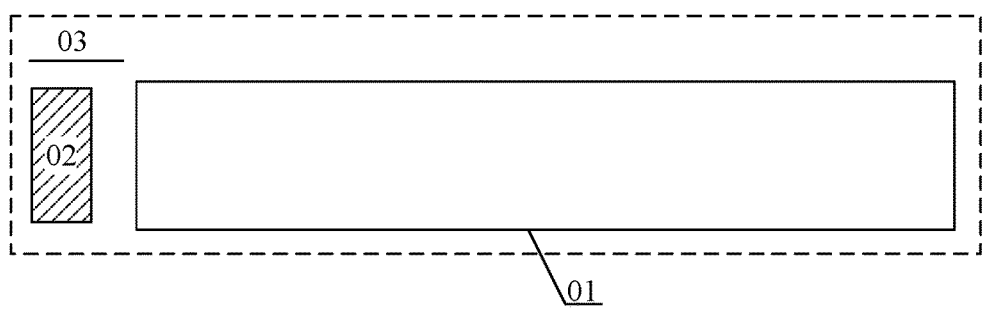
FIG. 8b is a second structural view illustrating a display device in an embodiment of the present invention.

Optionally, as shown in FIG. 8b, the display device 03 further comprises a light emitter 02, which controls the photochromic layer to switch between the transparent state and the opaque state.

In particular, when the display device only comprises the first photochromic layer 30, and the first photochromic layer 30 is an ultraviolet photochromic layer, the above-mentioned light emitter is an emitter emitting ultraviolet light. When the display device only comprises the first photochromic layer 30, and the first photochromic layer 30 is an infrared photochromic layer, the above-mentioned light emitter is an emitter emitting infrared light.

When the display device comprises the first photochromic layer 30 and the second photochromic layer 40, one of the first photochromic layer 30 and the second photochromic layer 40 is an ultraviolet photochromic layer and the other is an infrared photochromic layer, the above-mentioned light emitter comprises an emitter emitting ultraviolet light and an emitter emitting infrared light.

It is noted that embodiments of the present invention do not intend to limit the position of the light emitter. For example, it is arranged on a side face of the OLED display panel 01, provided that it illuminates the first photochromic layer 30, the first photochromic layer 30 and the second photochromic layer 40, or the first photochromic layer 30 and third photochromic layer 70, so as to make the respective layer to switch between the transparent state and the opaque state.

Figure 9:
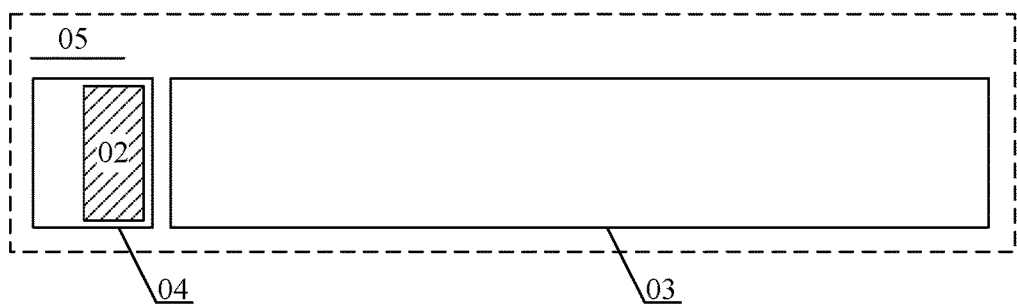
FIG. 9 is a structural view illustrating a display system in an embodiment of the present invention.

Embodiments of the present invention further provide a display system. For example, as shown in FIG. 9, the display system 05 comprises a display device 03 and a remote control 04. The remote control 04 comprises a light emitter 02, which controls the photochromic layer to switch between the transparent state and the opaque state. The display device 03 does not comprise a light emitter.

In particular, when the display device only comprises the first photochromic layer 30, and the first photochromic layer 30 is an ultraviolet photochromic layer, the above-mentioned light emitter is an emitter emitting ultraviolet light. When the display device only comprises the first photochromic layer 30 which is an infrared photochromic layer, the above-mentioned light emitter is an emitter emitting infrared light.

When the display device comprises the first photochromic layer 30 and the second photochromic layer 40, one of the first photochromic layer 30 and the second photochromic layer 40 is an ultraviolet photochromic layer, and the other is an infrared photochromic layer, the above-mentioned light emitter comprises an emitter emitting ultraviolet light and an emitter emitting infrared light.

Embodiments of the present invention provide an OLED display panel, a display device, and a display system. The OLED display panel comprises a base plate, first OLED display elements arranged in an array on a side of the base plate, and a first photochromic layer arranged on a side of the first OLED display elements. The first photochromic layer comprises first stripe shaped photochromic bodies and first stripe shaped openings arranged periodically and alternately, and is switchable between a transparent state and an opaque state. When the first photochromic layer stays in the opaque state, the first photochromic layer enables the OLED display panel to realize 3D display on the side where the first photochromic layer is arranged. 2D and 3D display modes are realized on a side of the display panel, which improves user experience and has a low cost.

The above description of the embodiments of this disclosure is provided only for illustrative and explanatory purposes, and it is not intended to be exhaustive or to limit the content of this disclosure. Therefore, the skilled person in the art will easily conceive of many modifications and transformations. In particular, the scope of this disclosure shall be defined by the claims attached.

What is claimed is:

1. An OLED display panel comprises:
a base plate;
a plurality of OLED display elements which are arranged in an array on a side of the base plate;
wherein the OLED display panel further comprises a first photochromic layer, which is arranged on a first side of the OLED display elements, comprises a plurality of first stripe shaped photochromic bodies and first stripe shaped openings being arranged periodically and alternately, and is switchable between a transparent state and an opaque state;
wherein the first photochromic layer enables the OLED display panel to realize 3D display on the side where the first photochromic layer is arranged when the first photochromic layer stays in the opaque state;
wherein the OLED display panel further comprises a second photochromic layer, which is arranged on a second side opposite to the first die of the OLED display elements comprises a plurality of second stripe shaped photochromic bodies and second stripe shaped openings arranged periodically and alternately, and switchable between a transparent state and an opaque state;
wherein the first photochromic layer and the second photochromic layer are arranged on opposite side of the base plate;
wherein the second photochromic layer enables the OLED display panel to realize 3D display on the side where the second photochromic layer is arranged when the second photochromic layer stays in the opaque state;
wherein the OLED display elements are dual side emitting OLED display elements; and
wherein, in a direction perpendicular to the base plate, the second stripe shaped photochromic bodies have projections overlapping those of the first stripe shaped photochromic bodies.

2. The OLED display panel of claim 1,
wherein the first photochromic layer is an ultraviolet photochromic layer; and wherein the first photochromic layer comprises 2-bis-diphenyl-imidazol paracyclophane doped with titanium dioxide nanoparticles or zinc oxide nanoparticles.

3. The OLED display panel of claim 1,
wherein the first photochromic layer is an infrared photochromic layer; and wherein the first photochromic layer comprises bisthienylethenes derivatives doped with titanium dioxide nanoparticles or zinc oxide nanoparticles.

4. The OLED display panel of claim 1,
wherein the first photochromic layer is an ultraviolet photochromic layer; and wherein the second photochromic layer is an infrared photochromic layer.

5. The OLED display panel of claim 1,
wherein the first photochromic layer is an infrared photochromic layer; and wherein the second photochromic layer is an ultraviolet photochromic layer.

6. A display device, comprise OLED display panel, wherein the OLED display panel comprises:
a base plate;
a plurality of OLED display elements which are arranged in an array on a side of the base plate;
a first photochromic layer arranged on a first side of the first OLED display elements, comprising a plurality of first stripe shaped photochromic bodies and first stripe shaped openings being arranged periodically and alternately, and switchable between a transparent state and an opaque state;
wherein, when the first photochromic layer stays in the opaque state, the first photochromic layer enables the OLED display panel to realize 3D display on the side where the first photochromic layer is arranged;
wherein the OLED display panel further comprises a second photochromic layer, which is arranged on a second side opposite to the first die of the OLED display elements comprises a plurality of second stripe shaped photochromic bodies and a plurality of second stripe shaped openings which are arranged periodically and alternately, and switchable between a transparent state and an opaque state;
wherein the first photochromic layer and the second photochromic layer are arranged on opposite side of the base plate; and
wherein, when the second photochromic layer stays in the opaque state, the second photochromic layer enables the OLED display panel to realize 3D display on the side where the second photochromic layer is arranged;
wherein the OLED display elements are dual side emitting OLED display elements; and
wherein, in a direction perpendicular to the base plate, the second stripe shaped photochromic bodies have projections overlapping those of the first stripe shaped photochromic bodies.

7. The display device of claim 6, further comprising a light emitter, which is configured to control the first photochromic layer to switch between the transparent and the opaque state.

8. The display device of claim 6,
wherein the first photochromic layer is an ultraviolet photochromic layer; and wherein the first photochromic layer comprises 2-bis-diphenyl-imidazol paracyclophane doped with titanium dioxide nanoparticles or zinc oxide nanoparticles.

9. The display device of claim 6,
wherein the first photochromic layer is an infrared photochromic layer; and wherein the first photochromic layer comprises bisthienylethenes derivatives doped with titanium dioxide nanoparticles or zinc oxide nanoparticles.

10. A display system, comprising the display device of claim 6 and a remote control, wherein the remote control comprises a light emitter, which is configured to control the first photochromic layer to switch between the transparent and the opaque state.

* * * * *